US008623732B2

(12) United States Patent
Grote et al.

(10) Patent No.: US 8,623,732 B2
(45) Date of Patent: Jan. 7, 2014

(54) METHODS OF MAKING LATERALLY DOUBLE DIFFUSED METAL OXIDE SEMICONDUCTOR TRANSISTORS HAVING A REDUCED SURFACE FIELD STRUCTURE

(75) Inventors: Bernhard H. Grote, Phoenix, AZ (US); Tahir A. Khan, Tempe, AZ (US); Vishnu K. Khemka, Phoenix, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 192 days.

(21) Appl. No.: 12/817,805

(22) Filed: Jun. 17, 2010

(65) Prior Publication Data

US 2011/0309442 A1 Dec. 22, 2011

(51) Int. Cl.
*H01L 21/331* (2006.01)
*H01L 29/66* (2006.01)

(52) U.S. Cl.
USPC .......... 438/369

(58) Field of Classification Search
USPC .......... 257/335, E29.027, E29.066, E29.256, 257/E29.261, 213, 288, 327, 339, 328, 343, 257/E21.417, E29.258; 438/369
See application file for complete search history.

(56) References Cited

U.S. PATENT DOCUMENTS 6,882,023 B2 4/2005 Khemka et al.
6,894,348 B2 * 5/2005 Terashima .......... 257/339
6,911,696 B2 6/2005 Denison
2001/0025961 A1 * 10/2001 Nakamura et al. .......... 257/107
2002/0053695 A1 * 5/2002 Liaw et al. .......... 257/328
2007/0045767 A1 * 3/2007 Zhu et al. .......... 257/505

OTHER PUBLICATIONS

Palumbo, V., et al., "High doped drain double-Resurf 100V P-channel MOS on SOI 0.35 µm BCD technology", IEEE, 20th International Symposium on Power Semiconductor Devices & IC's, May 18-22, 2008, Orlando, Florida.
Zhou, J., et al., Breakdown Walkout and its Reduction in High-Voltage pLDMOS Transistors on Thin Epitaxial Layer, IEEE, Electronics Letters, Jul. 30, 1992, vol. 28, No. 16.
Parthasarathy, V., et al., "SOA Improvement by a Double Resurf LDMOS Technique in a Power IC Technology", Semiconductor Products Sector, Motorola, inc., IEEE, 2000, IEDM, pp. 75-78.

* cited by examiner

*Primary Examiner* — Daniel Luke
*Assistant Examiner* — Khaja Ahmad
(74) *Attorney, Agent, or Firm* — Daniel D. Hill; David G. Dolezal

(57) ABSTRACT

An LDMOS transistor includes a substrate of semiconductor material, an insulator layer overlying the substrate, a semiconductor layer overlying the insulator layer, a RESURF region, and a gate. The semiconductor layer includes a first conductivity type well region, a second conductivity type source region in contact with the first conductivity type well region, a second conductivity type drain region. The RESURF region includes at least one first conductivity type material portion, and at least one portion of the at least one first conductivity type material portion electrically coupled to the first conductivity type well region. A semiconductor material having a second conductivity type is located below the RESURF region. The second conductivity type semiconductor material is also located over a part of the RESURF region. The gate is located over the first conductivity type well region and over the RESURF region.

16 Claims, 5 Drawing Sheets

METHODS OF MAKING LATERALLY DOUBLE DIFFUSED METAL OXIDE SEMICONDUCTOR TRANSISTORS HAVING A REDUCED SURFACE FIELD STRUCTURE

BACKGROUND

1. Field

This disclosure relates generally to semiconductors, and more specifically, to a laterally double diffused metal oxide semiconductor (LDMOS) transistor having a reduced surface field structure and method therefor.

2. Related Art

Laterally double diffused metal oxide semiconductor (LDMOS) transistors are used in mixed signal and analog circuits for high power switching. Optimization characteristics such as on resistance (Ron), break-down voltage (BVDSS), and safe operating area (SOA) often conflict. Also, depending on the needs of the particular application, good isolation and high side capabilities may be desirable or necessary. To have high side capability means that a transistor can have all of its terminals coupled to a high potential relative to the substrate, such as when a load is connected to the source of the LDMOS transistor with the drain connected to the supply voltage. Ideally, the performance of a high side capable device does not depend on the voltage between the terminals and the substrate within the rated voltage range. High side capability is desirable because it enables greater flexibility in circuit design, for example, it allows transistors to be stacked. Good isolation is desirable for minimizing substrate injection of charge carriers and enables robustness with respect to negative excursions of the drain-to-substrate voltage. A buried layer can be used to provide isolation from the substrate and to achieve high side capability, as well as for optimizing Ron and BVDSS by providing reduced surface field action (RESURF). However, the buried layer itself can become breakdown limiting. Another aspect related to a buried layer is the presence of associated parasitic bipolar transistors (BJT) that may limit the SOA. These problems can be addressed by providing a buried layer that only partially underlies the LDMOS structure; however, isolation and high side capability are sacrificed.

Therefore, what is needed is an LDMOS transistor that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
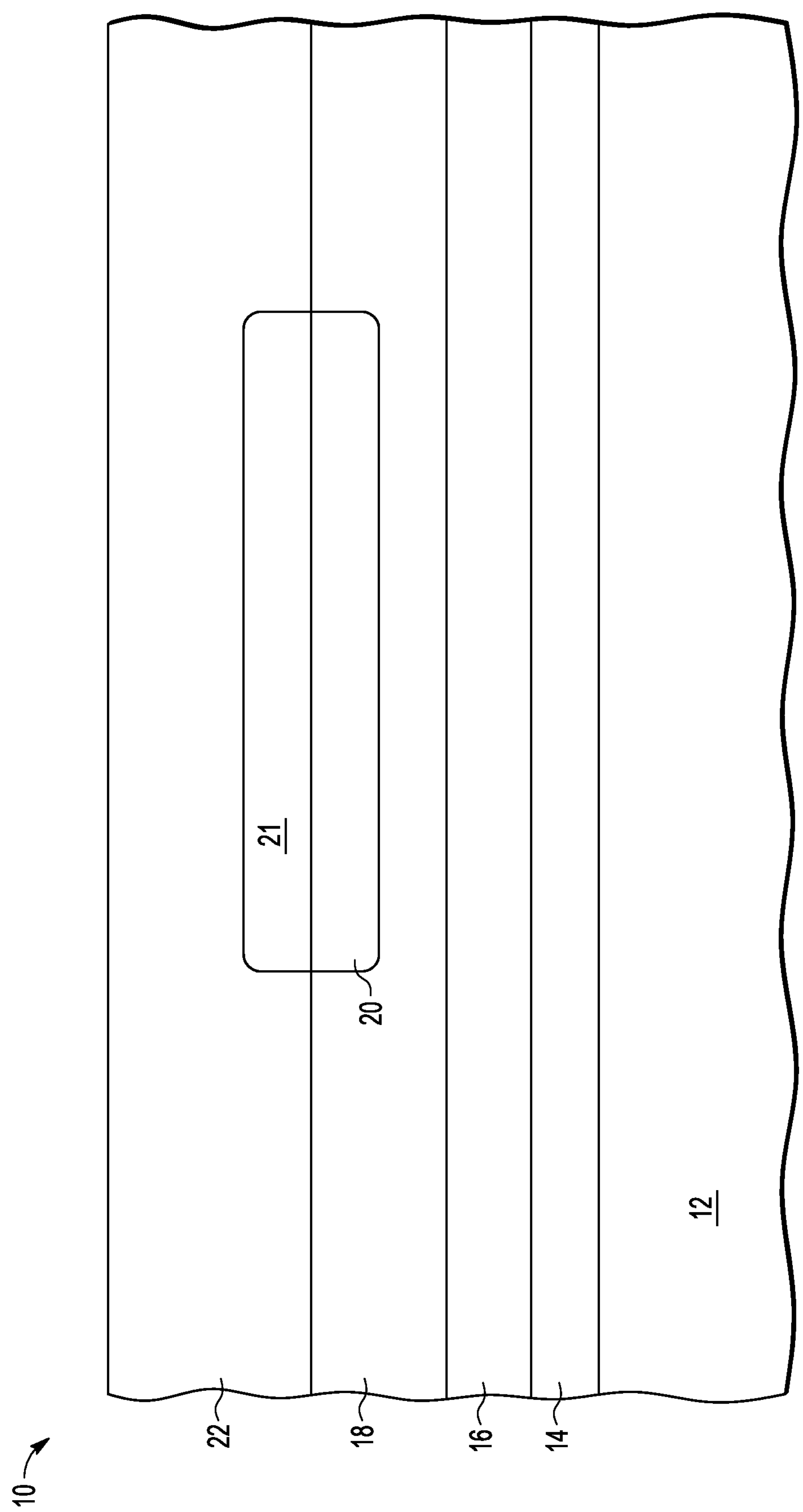
FIG. 1 illustrates a cross-sectional view of a semiconductor device at a processing stage according to an embodiment.

Generally, there is provided, a P-type LDMOS transistor that is isolated using a buried oxide layer and a deep trench. The deep trench may be filled with polysilicon in one embodiment. Also a lightly doped N-type RESURF region is connected to the source region via a N-type well region. The RESURF region extends to, but not completely under the drain region leaving a gap, or opening, under the drain region. The opening under the drain allows the drain potential to spread over the full depth of the epitaxial layer on top of the buried oxide (BOX) achieving a double RESURF action with the RESURF layer being depleted from P-regions situated above and below. The P-type LDMOS transistor with double RESURF action is realized using P-type epitaxially grown layers. The P-type epitaxially grown layers are typically only optimized for N-type LDMOS transistors leaving the P-type LDMOS in single RESURF configuration for an N-type buried layer. There is provided herein a semiconductor device in a high voltage analog technology having both N-type LDMOS transistors and P-type LDMOS transistors that uses P-type epitaxially grown layers for both transistor types and also provides double RESURF action for the P-type LDMOS transistors. High side capability is not compromised by the use of a buried oxide layer to provide isolation. Furthermore, the RESURF layer can be optimized without being constrained by high side capability or isolation requirements, thus providing an improved Ron versus BVDSS and SOA trade-off.

In one aspect, there is provided, a laterally double diffused metal oxide semiconductor (LDMOS) transistor comprising: a substrate of semiconductor material; an insulator layer overlying the substrate; a semiconductor layer overlying the insulator layer, the semiconductor layer including: a first conductivity type well region; a second conductivity type source region in contact with the first conductivity type well region; a second conductivity type drain region; and a reduced surface field (RESURF) region, the RESURF region including at least one first conductivity type material portion, at least one portion of the at least one first conductivity type material portion is electrically coupled to the first conductivity type well region, wherein second conductivity type semiconductor material is located below the RESURF region, wherein second conductivity type semiconductor material is located over a part of the RESURF region; and a gate located over the semiconductor layer, the gate is located over the first conductivity type well region, the gate is located over the RESURF region. The first conductivity type may be N-type and the second conductivity type may be P-type. The second conductivity type drain region may include at least a portion not located over the RESURF region.

In another aspect, there is provided, a P-type laterally double diffused metal oxide semiconductor (LDMOS) transistor comprising: a substrate of semiconductor material; an insulator layer overlying the substrate; a semiconductor layer overlying the insulator layer, the semiconductor layer including: a N-type well region; a P-type source region in contact with the N-type well region; a P-type drain region; and a reduced surface field (RESURF) region, the RESURF region including at least one N-type material portion, at least one portion of the at least one N-type material portion is electrically coupled to the N-type well region, wherein P-type semiconductor material is located below the RESURF region, wherein P-type semiconductor material is located over a part of the RESURF region; and a gate located over the semiconductor layer, the gate is located over the N-type well region, the gate is located over the RESURF region. The LDMOS transistor may further comprise a substrate contact extending through the semiconductor layer and the insulator layer for electrically coupling to the substrate. An N-type dopant concentration of the RESURF region may be higher next to the N-type well region than at a location closer to a location under the drain region. The RESURF region may be characterized as a contiguous region of N-type material. The RESURF region may be characterized as including a plurality of portions of N-type material separated laterally by P-type material of the semiconductor layer. The LDMOS transistor may further comprise a first P-type well region, the P-type well region in contact with the P-type drain region, a portion of the P-type well region extending under the gate, wherein a part of the RESURF region may be located under a part of the P-type well region. The P-type drain region may include at least a portion not located over the RESURF region.

In yet another aspect, there is provided, a method of making a laterally double diffused metal oxide semiconductor (LDMOS) transistor, the method comprising: implanting first conductivity type dopants into a layer of second conductivity type semiconductor material for forming a reduced surface field (RESURF) region of the LDMOS transistor, wherein the layer of second conductivity type semiconductor material is located over an insulator layer, the insulator layer is located over a semiconductor substrate; forming a first conductivity type well region, where the first conductivity type well region is electrically coupled to the RESURF region; forming a gate over the semiconductor layer, over the first conductivity type well region, and over the RESURF region; forming a second conductivity type source region in the first conductivity type well region; and forming a second conductivity type drain region; wherein the RESURF region is located over second conductivity type semiconductor material, wherein second conductivity type semiconductor material is located over a part of the RESURF region. The implanting of first conductivity type dopants may be characterized as implanting first conductivity type dopants into a contiguous area of the layer of second conductivity type semiconductor material. The implanting of first conductivity type dopants may be characterized as implanting first conductivity type dopants into non contiguous areas of the layer of second conductivity type semiconductor material. After implanting, the wafer may be heated so that the first conductivity type dopants diffuse into a contiguous area of the first conductivity type semiconductor material. The method may further comprise forming a second conductivity type well region, where the second conductivity type drain region may be formed in the second conductivity type well region, wherein a portion second conductivity type well region may be located over the RESURF region. The method may further comprise epitaxially growing second conductivity type semiconductor material on the layer of second conductivity type semiconductor material after the implanting, wherein the second conductivity type source region and the second conductivity type drain material may be formed in the epitaxially grown second conductivity type semiconductor material. At least a portion of the first conductivity type well region may be located in the epitaxially grown second conductivity type semiconductor material. A first end of a RESURF region may be located under the second conductivity type source region, wherein a second end of the RESURF region may be located laterally towards a location under the second conductivity type drain region, wherein the first end may include a greater concentration of first conductivity type dopants than the second end. A portion of the drain region may not be located over the RESURF region. The first conductivity type may be N-type and the second conductivity type may be P-type.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

Also, two regions having the same conductivity type are considered to be electrically coupled together if the regions are in physical contact, if the regions overlap, or if the regions are spaced apart but with the spacing being sufficiently close for the same conductivity type regions to merge by lateral diffusion during processing. In addition, the two regions having the same conductivity type are electrically coupled together if they are spaced apart but are sufficiently close enough for an electrical potential below a rated blocking voltage to punch-through between the two regions. Further, the two regions having the same conductivity type are electrically coupled together if they are physically spaced apart but electrically connected by other means, such as for example, vias, contacts, conductive layers, or the like.

FIG. 1 illustrates a cross-sectional view of LDMOS transistor 10 at a processing stage. LDMOS transistor 10 includes an N-type lightly doped substrate 12. An insulating layer 14 is formed on a surface of substrate 12. In one embodiment, insulating layer 14 is silicon dioxide grown to a thickness of about 0.1 to 1.1 microns. In another embodiment, insulating layer 14 may be a deposited oxide. A semiconductor layer 16 is formed on insulating layer 14. In one embodiment, semiconductor layer 16 is a silicon layer that is about 0.3-1.5 μm thick and is lightly doped with a P-type dopant. In one embodiment, substrate 12, insulating layer 14, and semiconductor layer 16 may be provided as an SOI (silicon-on-insulator) wafer.

Figure 5:
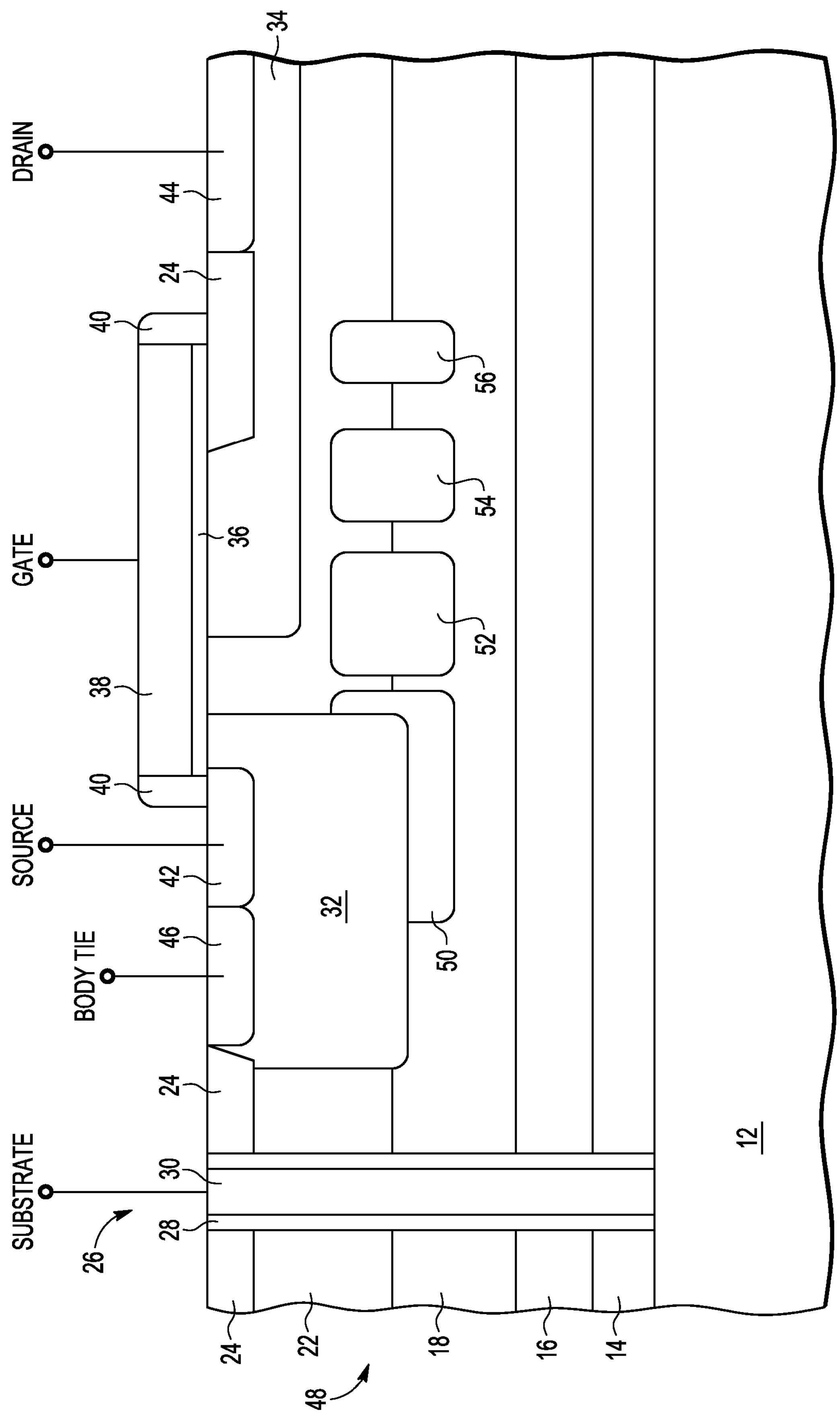
FIG. 5 illustrates a cross-sectional view of an LDMOS transistor in accordance with another embodiment.

P-type epitaxial layer 18 is grown on semiconductor layer 16 to a thickness of about 1-4 μm, sufficient to suppress back-gate effects on the device operation within the rated voltage range, and is doped with boron to a concentration of about 1e14-1e16 atoms per $cm^3$. To form RESURF region 20, epitaxial layer 18 is implanted with an N-type dopant, for example, phosphorus to a concentration of about 1e16-5e17 atoms per $cm^3$ in an area defined using an implant mask (not shown). As can be seen, RESURF region 20 does not extend all the way to the bottom of P-type epitaxial layer 18. P-type epitaxial layer 22 is then grown on P-type epitaxial layer 18 to a thickness of about 1-4 μm with a doping concentration of about 1e14-1e16 atoms per $cm^3$ of boron. After epitaxy and further thermal processing, part of the implanted region 20 may diffuse into layer 22 as indicated by portion 21 in FIG. 1 to form region 23 in FIG. 2. Note that P-type epitaxial material from layer 18 remains below RESURF region 23 and P-type epitaxial material from layer 22 remains above RESURF region 23. In another embodiment, P-type epitaxial layer 18 and P-type epitaxial layer 22 can be formed as a single P-type epitaxial layer having a RESURF region formed in a middle portion of the single P-type epitaxial layer by implantation from the surface. Also, in another embodiment, a contiguous RESURF region can be formed in semiconductor layer 16, thus eliminating the need for one of layers 18 or 22. In addition, in another embodiment, RESURF region 23 may have a greater concentration of N-type dopants in the end contacting N-well 32 than in the opposite end near drain region 44. Further, in another embodiment, the RESURF region can be formed as a plurality of portions of doped N-type regions separated laterally by P-type material as illustrated in FIG. 5.

Figure 2:
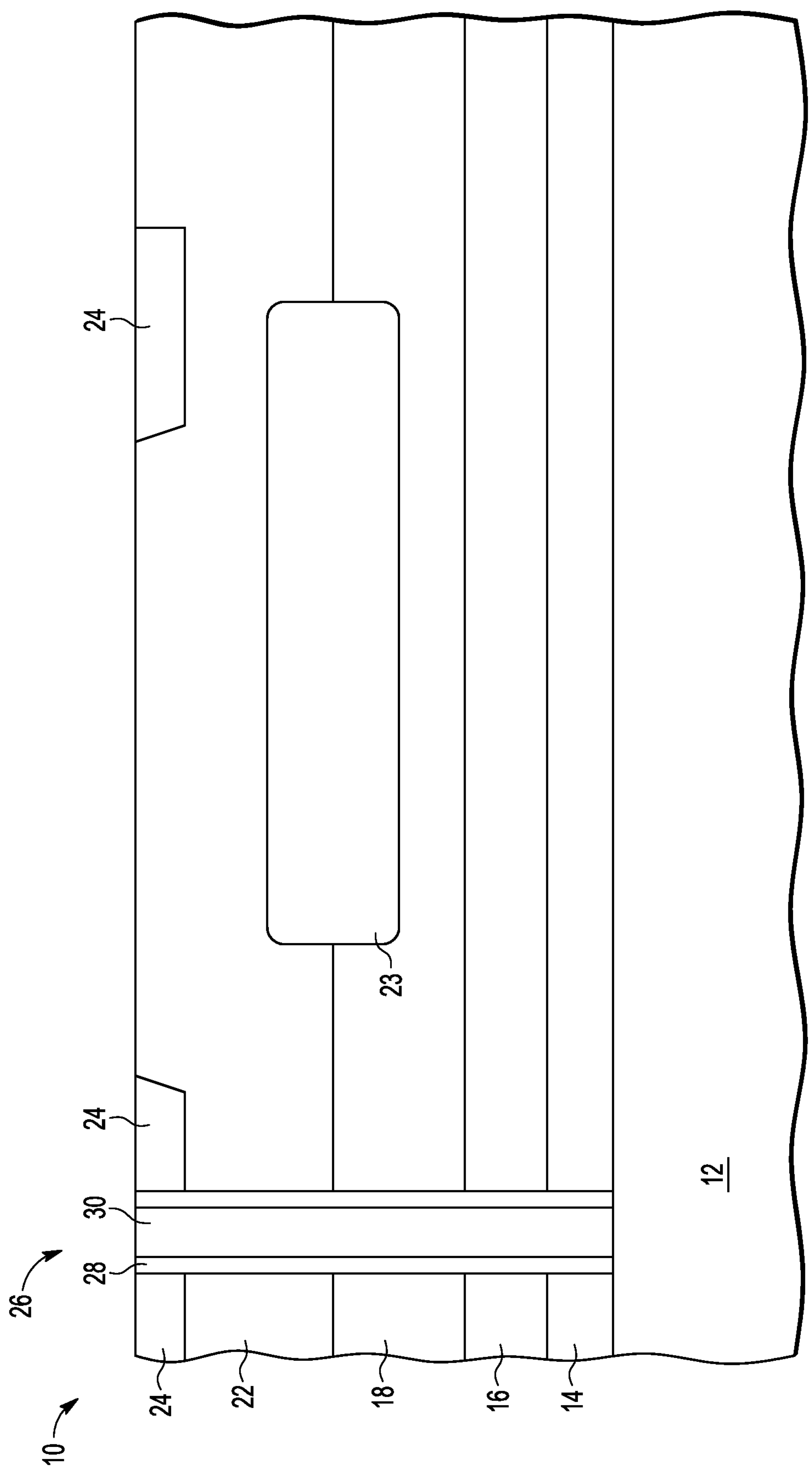
FIG. 2 illustrates a cross-sectional view of a semiconductor device at a subsequent processing stage.

FIG. 2 illustrates a cross-sectional view of LDMOS transistor 10 at a subsequent processing stage. In FIG. 2, shallow trench isolation (STI) regions 24 are formed in epitaxial layer 22 using a conventional STI processing technique. Deep trench isolation 26 is formed through a portion of STI 24 to a surface of substrate 12. An oxide layer 28 is then formed on a surface of epitaxial layer 22 and on the sides and bottom of deep trench isolation 26. Deep trench isolation 26 is then filled with polysilicon 30 in one embodiment. In another embodiment, deep trench isolation 26 may be filled with another material. If polysilicon 30 is used to provide a substrate contact on the top side of semiconductor device 10, the oxide fill and BOX layer at the bottom of the deep trench is removed before filling with polysilicon. In another embodiment, substrate 12 may be contacted from the bottom of semiconductor device 10. A conventional chemical mechanical polishing (CMP) process is used to remove deep trench fill materials from a top surface of epitaxial layer 22.

Figure 3:
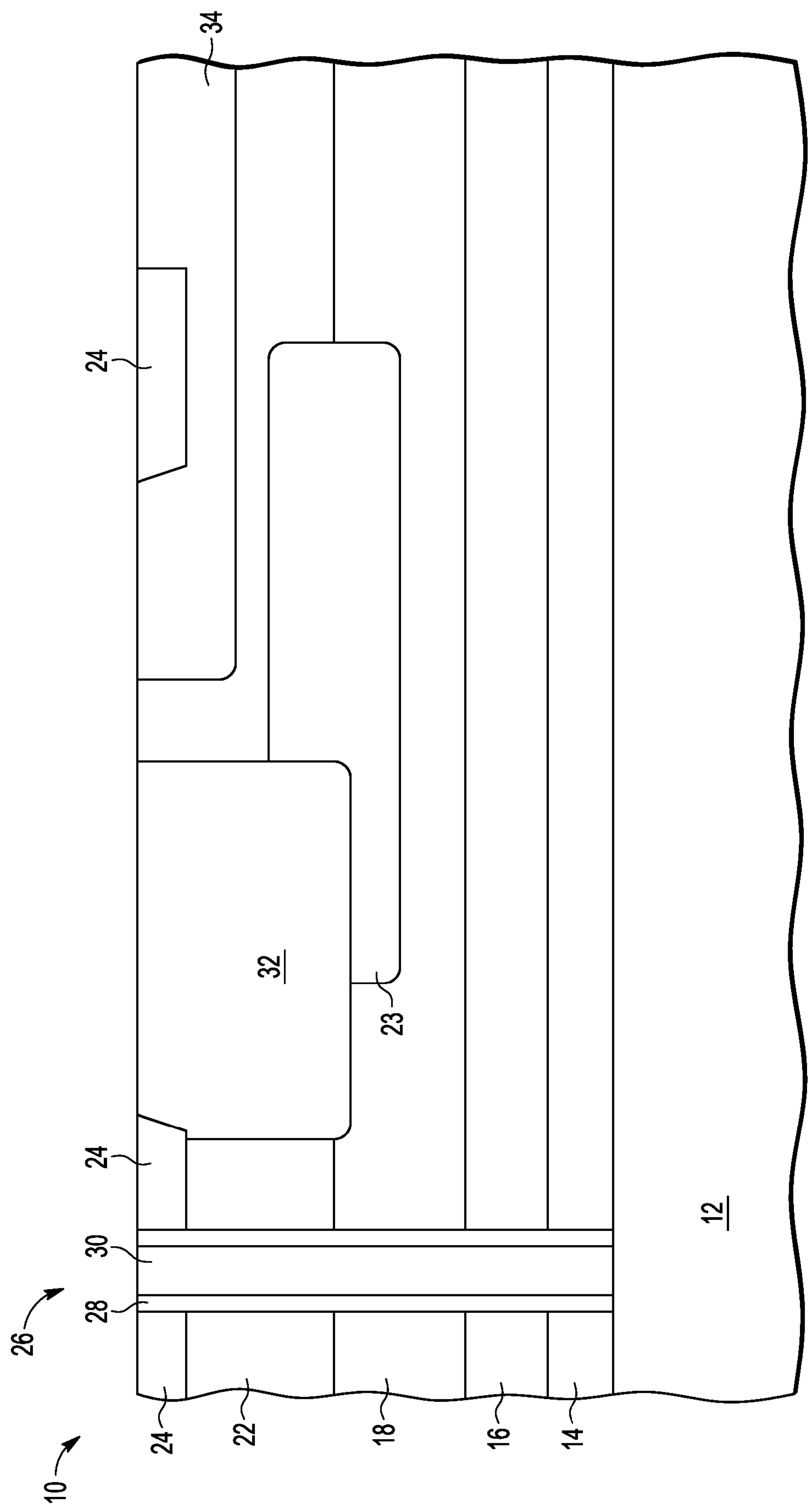
FIG. 3 illustrates a cross-sectional view of a semiconductor device at a subsequent processing stage.

FIG. 3 illustrates a cross-sectional view of LDMOS transistor 10 at a subsequent processing stage. An N-well 32 is formed in epitaxial layer 22 and epitaxial layer 18. The N-well 32 merges with, and is electrically connected to, RESURF region 23. Also, a P-well 34 is formed in epitaxial layer 22.

Figure 4:
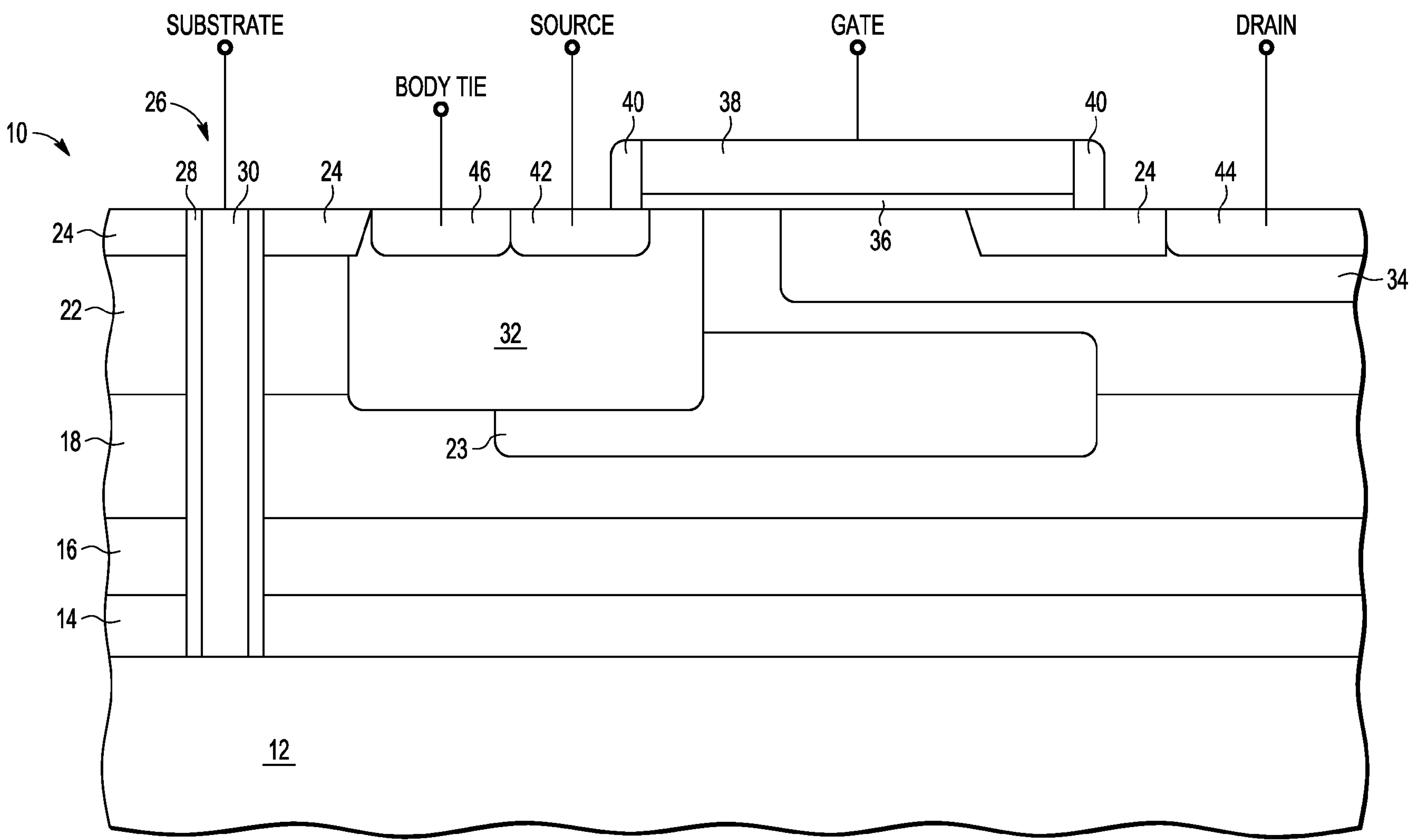
FIG. 4 illustrates a cross-sectional view of a semiconductor device at a subsequent processing stage and producing an LDMOS transistor in accordance with an embodiment.

FIG. 4 illustrates a cross-sectional view of LDMOS transistor 10 at a subsequent processing stage. A dielectric layer is grown on the surface of epitaxial layer 22 to form a gate dielectric layer 36. In another embodiment, dielectric layer 36 may be a deposited gate dielectric. A polysilicon layer is formed on dielectric layer 36 and patterned to form a polysilicon gate 38 over epitaxial layer 22, N-well 32, RESURF region 23, and P-well 34. In another embodiment, the gate may be formed from a different conductive material. Sidewall spacers 40 are then formed on the sides of gate 38. A P-type source region 42 is implanted or diffused into N-well 32. An N-type body tie region 46 is formed in N-well 32 next to the source region 42. Also, a P-type drain contact region 44 is implanted or diffused into P-well 34. As can be seen, at least a portion of drain region 44 is not located directly over RESURF region 23 so that the drain potential will spread over the full depth of the epitaxial layers 16, 18, and 22.

Further conventional semiconductor processing is used to complete the device and provide contacts for the gate, source, drain, body tie, and substrate and will not be described in more detail.

FIG. 5 illustrates a cross-sectional view of an LDMOS transistor 48 in accordance with another embodiment. LDMOS transistor 48 is the same as LDMOS transistor 10 except that transistor 48 has the RESURF region divided into multiple non-contiguous portions 50, 52, 54, and 56. The spacing of the openings between the multiple portions and the size of the portions can be varied to tailor the potential distribution. Spacing can be sufficiently close for the portions to merge by lateral diffusion. Also, spacing should be sufficiently close to allow the potential to punch-through, such that the non-contiguous portions 50, 52, 54, and 56 are electrically coupled to N-well 32. In another similar embodiment, RESURF portion 50 may not be present, and a spacing between portion 52 and N-well 32 is sufficiently close for N-well 32 to electrically couple directly to portion 52 via punch-through of the electric potential, or by merging due to lateral diffusion. Alternatively, an electrical coupling between portions 52, 54, 56, and N-well 32 could be established by an electrical connection elsewhere in the LDMOS structure, for example in the device termination, allowing for larger spacing between portions 52, 54, 56, and N-well 32.

In a high voltage LDMOS device, it is desirable that the voltage blocking capability BVDSS be high for a gate voltage below the threshold voltage, while also having low on resistance when the gate voltage is higher. Both characteristics depend on the properties of the accumulation region, which is the P-type material of regions 22 and 34 adjacent to the channel extending laterally to the field oxide region, and on the properties of the drift region, which is the portion of the P-type material of regions 22 and 34 underlying the field oxide region and extending laterally from the accumulation region to the drain region 44. In the off-state, most of the electric potential drops between the heavily doped drain contact region 44 and the channel region formed by the portion of N-well 32 underlying gate 38. Mutual layer depletion due to double RESURF action promotes a uniform field distribution in the off state, thus resulting in a high breakdown voltage for a given drift length and doping level. On the other hand, the double RESURF action will allow for a shorter drift length and/or higher doping resulting in lower on resistance compared to a single RESURF structure for a given target voltage rating. The drift region above the RESURF region is depleted from above by the portion of the gate extending onto the drift region, and below by the RESURF layer. Because the RESURF layer can also be depleted by the P-type regions P-well 34 and epitaxial layer 22, situated above the RESURF layer, and below by semiconductor layer 16 and P-type epitaxial layer 18, the charge balance allows for high doping in the drift region enabling low on resistance without the RESURF layer itself becoming break-down limiting. As can be seen in the illustrated embodiments, P-type epitaxial material is provided both above and below RESURF region 23. Also, a gap, or space is provided around RESURF region 23 leaving a P-type connection below or around drain region 44 so that the drain potential will spread over the full depth of the epitaxial layers 18 and 22, and semiconductor layer 16, which in turn are depleted by the RESURF layer under high voltage blocking conditions.

The use of P-type epitaxial layers 18 and 22 for P-type LDMOS transistor 10 provides the advantage of a double RESURF configuration while also supporting the fabrication of N-type LDMOS transistors on the same integrated circuit, or die. High side capability is not compromised by using buried oxide isolation in conjunction with a thick epitaxial layer. Also, the use of dielectric isolation simplifies the integration of the LDMOS transistors with other device types.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a laterally double diffused metal oxide semiconductor (LDMOS) transistor, the method comprising:

forming a reduced surface field (RESURF) region of a first conductivity type in a second conductivity type semiconductor material, wherein the second conductivity type semiconductor material is located over an insulator layer, the insulator layer is located over a semiconductor substrate, a first portion of the second conductivity type semiconductor material remains below the RESURF region, a second portion of the second conductivity type semiconductor material remains above the RESURF region, and an opening in the RESURF region is present between the first and second portions of the second conductivity type semiconductor material, wherein the RESURF region is depleted by the first and second portions of the second conductivity type semiconductor material below and above the RESURF region;

forming a first conductivity type well region, where the first conductivity type well region partially merges with the RESURF region such that the RESURF region remains on a portion of a bottom surface and a sidewall surface of the first conductivity type well region which is electrically coupled to the RESURF region;

forming a gate over the second conductivity type semiconductor material, over the first conductivity type well region, and over the RESURF region;

forming a second conductivity type source region in the first conductivity type well region; and forming a second conductivity type drain region over the opening in the RESURF region to allow a drain potential to spread through the opening to a full depth of the second conductivity type semiconductor material over the insulator layer to achieve a double RESURF action.

2. The method of claim 1 wherein forming the RESURF region includes implanting first conductivity type dopants into a contiguous area of the second conductivity type semiconductor material.

3. The method of claim 1 wherein forming the RESURF region includes implanting first conductivity type dopants into non contiguous areas of the second conductivity type semiconductor material.

4. The method of claim 3, wherein after implanting, heating the second conductivity type semiconductor material, wherein the first conductivity type dopants diffuse into a contiguous area of the first conductivity type semiconductor material.

5. The method of claim 1 further comprising forming a second conductivity type well region, where the second conductivity type drain region is formed in the second conductivity type well region, and wherein a portion of the second conductivity type well region is located over the RESURF region.

6. The method of claim 1 wherein forming the RESURF region in the second conductivity type semiconductor material comprises:

implanting first conductivity type dopants into the first portion of the second conductivity type semiconductor material; and epitaxially growing the second portion of the second conductivity type semiconductor material on the first portion of the second conductivity type semiconductor material after the implanting, wherein the second conductivity type source region and the second conductivity type drain material are formed in the epitaxially grown second portion of the second conductivity type semiconductor material.

7. The method of claim 6 wherein at least a portion of the first conductivity type well region is located in the epitaxially grown second portion of the second conductivity type semiconductor material.

8. The method of claim 1 wherein a first end of a RESURF region is located under the second conductivity type source region, wherein a second end of the RESURF region is located at the opening, and wherein the first end includes a greater concentration of first conductivity type dopants than the second end.

9. The method of claim 1 wherein a portion of the drain region is not located over the RESURF region.

10. The method of claim 1 wherein the first conductivity type is N-type and the second conductivity type is P-type.

11. The method of claim 1, wherein the RESURF region comprises a plurality of non-contiguous portions between the drain region and the well region.

12. The method of claim 1, further comprising:

forming deep trench isolation extending to the insulator layer.

13. The method of claim 11, further comprising:

forming shallow trench isolation adjacent the drain region and partially underlying the gate.

14. A method of making a laterally double diffused metal oxide semiconductor (LDMOS) transistor, the method comprising:

forming an insulator layer overlying a substrate of semiconductor material;

forming a semiconductor layer overlying the insulator layer, the semiconductor layer including:

a first conductivity type well region;

a second conductivity type source region in contact with the first conductivity type well region;

a second conductivity type drain region; and a reduced surface field (RESURF) region, the RESURF region including at least one first conductivity type material portion, at least one portion of the at least one first conductivity type material portion is electrically coupled to the first conductivity type well region and the first conductivity type well region partially merges with the RESURF region such that the RESURF region remains on a portion of a bottom surface and a sidewall surface of the first conductivity type well region, a first portion of a second conductivity type semiconductor material remains below the RESURF region, a second portion of the second conductivity type semiconductor material remains above the RESURF region, and an opening in the RESURF region is present between the first and second portions of the second conductivity type semiconductor material, wherein the RESURF region is depleted by the first and second portions of the second conductivity type semiconductor material below and above the RESURF region, forming a gate located over the semiconductor layer, wherein the gate is located over the first conductivity type well region, and the gate is located over the RESURF region; and forming a second conductivity type drain region over the opening in the RESURF region to allow a drain potential to spread through the opening to a full depth of the second conductivity type semiconductor material over the insulator layer to achieve a double RESURF action.

15. The method of claim 14 wherein the RESURF region is characterized as a contiguous region.

16. The method of claim 14 wherein the RESURF region is characterized as including a plurality of RESURF region portions between the drain region and the well region, which are separated laterally by the second conductivity type semiconductor material.

* * * * *